(12) United States Patent
Hong et al.

(10) Patent No.: US 6,580,057 B2
(45) Date of Patent: Jun. 17, 2003

(54) ENHANCED COOLING IMP COIL SUPPORT

(75) Inventors: Richard Hong, San Jose, CA (US);
James H. Tsung, San Jose, CA (US);
Gunnar Vatvedt, Los Gatos, CA (US);
Peijun Ding, San Jose, CA (US);
Arvind Sundarrajan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/016,350

(22) Filed: Dec. 10, 2001

(65) Prior Publication Data

US 2002/0046990 A1 Apr. 25, 2002

Related U.S. Application Data

(62) Division of application No. 09/350,619, filed on Jul. 9, 1999.

(51) Int. Cl.⁷ .............................. H05B 3/68; C23C 16/00
(52) U.S. Cl. ................... 219/444.1; 118/723 I
(58) Field of Search ............... 219/443.1, 444.1, 219/541, 542; 118/724, 725, 722, 723 R, 723 VE, 723 I

(56) References Cited

U.S. PATENT DOCUMENTS

| 5,078,851 A | 1/1992 | Nishihata et al. ....... 204/298.34 |
| 5,663,865 A | 9/1997 | Kawada et al. ............. 361/234 |
| 5,677,253 A | 10/1997 | Inoue et al. .................. 501/98 |
| 5,688,331 A | 11/1997 | Aruga et al. ................ 118/725 |
| 5,851,298 A | 12/1998 | Ishii ........................... 118/728 |
| 5,950,444 A | 9/1999 | Matsunaga ................. 62/259.2 |
| 5,973,261 A | 10/1999 | Chevallet et al. ........ 174/17 VA |
| 5,981,913 A | 11/1999 | Kadomura et al. ...... 219/444.1 |
| 6,376,807 B1 * | 4/2002 | Hong et al. .............. 219/444.1 |

FOREIGN PATENT DOCUMENTS

EP 0896362 A1 2/1999 ........... H01L/21/00

OTHER PUBLICATIONS

Search Report, SG Patent Application No. 200003698–8, Mar. 12, 2002.

\* cited by examiner

*Primary Examiner*—Sang Paik
(74) *Attorney, Agent, or Firm*—Moser, Patterson & Sheridan LLP

(57) ABSTRACT

The present invention generally provides a substrate processing system having a thermally conductive and electrically insulative member coupled to a heated member that provides for heat dissipation from the heated member. In a preferred embodiment, the present invention provides for heat dissipation through thermal conductance of an electrically insulated coil in an IMP reaction chamber.

27 Claims, 4 Drawing Sheets

ENHANCED COOLING IMP COIL SUPPORT

CROSS-REFERENCE TO RELATED APPLICATION

This is a divisional of copending application, Ser. No. 09/350,619 filed on Jul. 9, 1999.

BACKGROUND OF THE INVENTION

1. Field of the Invention

The present invention relates to a system and method for processing substrates. Specifically, the invention relates to a system and method having a thermally conductive and electrically insulative member to dissipate heat in a substrate processing chamber.

2. Description of the Related Art

Sub-quarter micron multi-level metallization represents one of the key technologies for the next generation of ultra large scale integration (ULSI) for integrated circuits (ICs). As circuit densities increase, the widths of vias, contacts and other features decrease to 0.25 μm or less, while the thicknesses of the dielectric layers remains substantially constant, with the result that the aspect ratios for the features, i.e., their height divided by width, increases. Many traditional deposition processes have difficulty filling structures where the aspect ratio exceeds 4:1, and particularly where it approaches 10:1.

To obtain deposition in the high aspect ratio features, one method uses a high pressure physical vapor deposition (PVD) process known as an ionized metal plasma (IMP) process. Generally, IMP processing offers the benefit of highly directional deposition with good bottom coverage on high aspect ratio structures. FIG. 1 is a schematic of a typical IMP chamber 10, having a coil 22 supported by a support 30 in the chamber 10. Typically, processing gas, such as helium or argon, is injected into the chamber and a power supply 12 delivers a bias to a target 14 to generate a plasma 13 of processing gas ions between the target and a substrate support 16, that supports a substrate 18. The ions impact the target and sputter material from the target, where some of the material is directed toward the substrate. A second power supply 20 delivers power to a coil 22 that is disposed between the target 14 and the substrate 18. The coil increases the density of the plasma and ionizes the sputtered material that traverses through the magnetic fields generated by the coil and the intensified plasma. A third power supply 24 biases the substrate and attracts the sputtered material ions in a highly directionalized manner to the surface of the substrate to better fill high aspect ratio features in the substrate. A clamp ring 26 is circumferentially disposed about the substrate to retain the substrate in position. A shield 28 is disposed between the chamber sidewalls and the sputtered material to avoid deposition of the sputtered material on the chamber sidewalls. Because the shield 28 is conductive, typically made of aluminum, and grounded and the coil 22 is conductive and electrically powered, electrical insulation between the two components is typically desired with an electrically insulative support 30.

FIG. 2 shows details of the typical support 30 of FIG. 1. The coil 22 is attached to the shield 28 by the combination of an internally threaded pin 36 at the coil coupled with a screw 34 near the shield having external threads 32. Because the coil is also sputtered by the plasma ions during the process, the coil is generally made from the same material as the target, e.g., copper. The pin and screw are insulated from the shield by an insulative support labyrinth 40, typically made of aluminum oxide (alumina). The alumina labyrinth is both electrically and thermally insulative. An inner cup 42 is placed between the coil and the support labyrinth to protect the inner surfaces of the support 30 from the sputtered material in proximity to the support. Because the inner cup is exposed to the plasma ions, generally the inner cup is also made from the same material as the coil. An outer cup 44, attached to the shield by bolts 46a, 46b, circumferentially encloses a portion of the inner cup to reduce sputtered material deposition on the inner surfaces of the support 30 and is generally made of conductive material, such as stainless steel. The assembly of the inner cup, support labyrinth, and outer cup between the shield and the coil are held in position by the screw 34 and pin 36. An insulative ceramic cap 48 protects and insulates the screw 34 from the chamber surfaces.

It has been discovered that heat buildup in the chamber, and particularly in the coil which is energized with power to generate the plasma, can have disadvantageous effects on the substrate process and resulting films. The heat can cause the structural components, such as the coil, to be distorted in shape, thereby altering the plasma density and shape. An increase in temperature can also cause the sputtering rates to change with varying coil temperatures. Increased temperatures can also limit the amount of power which can be applied to the coil without causing overheating of the coil. It is known that heat can be dissipated through conductive elements attached to a heat sink. However, typical conductive materials that channel heat to a heat sink are also electrically conductive which would disadvantageously affect the ability of the coil or other insulated electrical components to function properly.

Furthermore, the heat dissipation is hindered under vacuum conditions by the typical attachment, such as bolting or clamping, of the structural components. Under vacuum conditions, there are few molecules to transfer heat between adjacent surfaces. Even polished surfaces under magnification show irregularities in the surface. By bolting or clamping two surfaces together, the heat transfer across the interface between the surfaces is limited to the direct contact of the microscopic surfaces and hindered by the absence of interspaced molecules under vacuum conditions between the non-contacting portions of the two surfaces. Typically, greater numbers of interfaces causes an increased resistance to conduction. The typical support 30 has several interfaces and thus interferes with heat transfer.

Therefore, there remains a need to increase the thermal conductance between a chamber component, such as a coil, and a heat sink to allow the thermal loads to be dissipated more readily and yet still provide electrical insulation for the chamber component, especially under vacuum conditions.

SUMMARY OF THE INVENTION

The present invention generally provides a substrate processing system having a thermally conductive and electrically insulative member coupled to a heated member that provides for heat dissipation from the heated member. In a preferred embodiment, the present invention provides for heat dissipation through thermal conductance of an electrically insulated coil in an IMP reaction chamber.

In one aspect, the invention provides a system for processing a substrate, comprising a chamber, an electrically conductive member, and a thermally conductive and electrically insulative support supporting the electrically conductive member comprising a component having a thermal conductance value of at least 90 watts per meter-degree Kelvin (W/m-K) and an dielectric strength value as an indicator of electrical resistivity of at least $10^{14}$ kilovolts/millimeter (kV/mm). In another aspect, the invention provides a system for processing a substrate, comprising a chamber, an electrically conductive member in proximity to the chamber, and a thermally conductive and electrically insulative support supporting the electrically conductive member, the support comprising a component selected from the group consisting essentially of aluminum nitride and beryllium oxide. In another aspect, the invention provides a support for a substrate processing system comprising a ceramic and a metal conductor bonded to the ceramic. The invention also includes a method of cooling a substrate processing chamber, comprising providing a chamber, supporting an electrically conductive member in the chamber with a thermally conductive and electrically insulative bonded support, and providing at least one heat flow path from the electrically conductive member to the chamber through one or more bonded connections of the support. In another aspect, the invention provides a support for a substrate processing system, comprising a semi-conductor ceramic having a thermal conductance value of at least 90 W/m-K and a dielectric strength value of at least $10^{14}$ kV/mm. In yet another aspect, the invention provides a support for a substrate processing system, comprising a semi-conductor ceramic selected from the group consisting essentially of aluminum nitride and beryllium oxide.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 3:
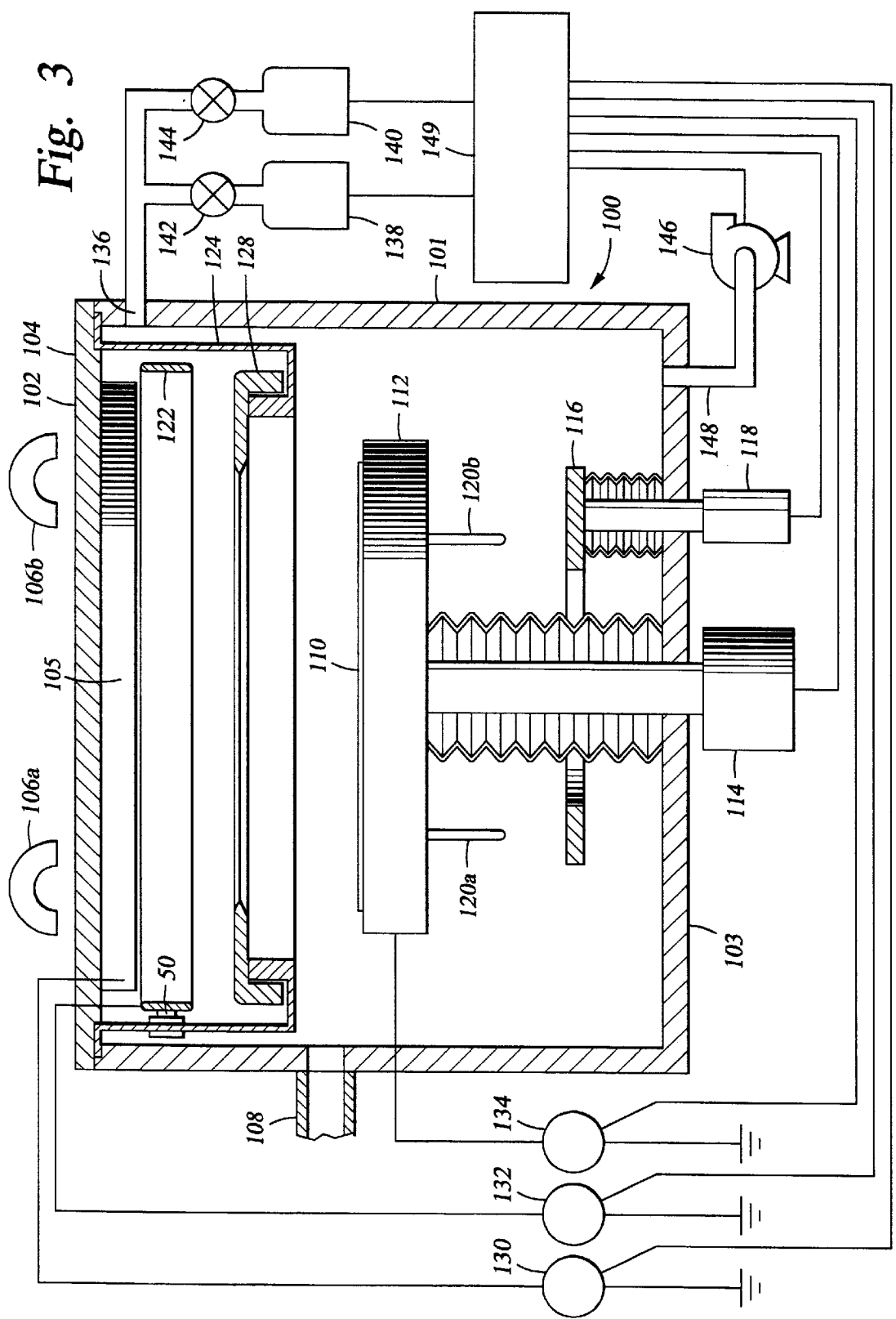
FIG. 3 is a schematic cross sectional view of a chamber in which the electrically insulated member and support of the present invention can be used.

FIG. 3 is a schematic cross-sectional view of an IMP chamber 100 in which the support of the present invention may be used to advantage to electrically insulate an electrically conductive member, such as a coil from other camber components. An ion metal plasma (IMP) processing chamber, known as an IMP VECTRA™ chamber is available from Applied Material Inc. of Santa Clara, Calif. The IMP chamber can be integrated into an Endura® platform, also available from Applied Materials, Inc. The chamber 100 includes sidewalls 101, lid 102, and bottom 103. The lid 102 includes a target backing plate 104 which supports a target 105 of the material to be deposited. An opening 108 in the chamber 100 provides access for a robot (not shown) to deliver and retrieve substrates 110 to and from the chamber. A substrate support 112 supports the substrate 110 and is typically grounded. The substrate support is mounted on a lift motor 114 that raises and lowers the substrate support 112 and a substrate 110 disposed thereon. A lift plate 116 connected to a lift motor 118 is mounted in the chamber and raises and lowers pins 120a, 120b mounted in the substrate support. The pins raise and lower the substrate 110 from and to the surface of the substrate support 112. A coil 122 is mounted between the substrate support 112 and the target 105 and provides inductive magnetic fields in the chamber to assist in generating and maintaining a plasma between the target and substrate. The coil densifies the plasma which ionizes the sputtered material. The ionized material is then directed toward the substrate and deposited thereon. A shield 124 is disposed in the chamber to shield the chamber walls from the sputtered material. The shield also supports the coil 122 via supports 50 of the invention. The supports 50 electrically insulate the coil 122 from the shield 124 and the chamber 100. The clamp ring 128 is mounted between the coil 122 and the substrate support 112 and shields an outer edge and backside of the substrate from sputtered materials when the substrate is raised into a processing position to engage the lower portion of the clamp ring. In some chamber configurations, the shield 124 supports the clamp ring when the substrate is lowered below the shield to enable substrate transfer.

Three power supplies are used in this type of inductively coupled sputtering chamber. A power supply 130 delivers either RF or DC power to capacitively couple energy into target 105 to cause the processing gas to form a plasma. Magnets 106a, 106b disposed behind the target plate 104 increase the density of a plasma adjacent to the target in order to increase the sputtering efficiency. A power source 132, preferably a RF power source, supplies electrical power in the megahertz range to the coil 122 to increase the density of the plasma. Another power source 134, either a RF or a DC power source, biases the substrate support 112 with respect to the plasma and provides directional attraction of the ionized sputtered material toward the substrate.

Processing gas, such as an inert gas of argon or helium, is supplied to the chamber 100 through a gas inlet 136 from gas sources 138, 140 as metered by respective mass flow controllers 142, 144. A vacuum pump 146 is connected to the chamber at an exhaust port 148 to exhaust the chamber and maintain the desired pressure in the chamber.

A controller 149 controls the functions of the power supplies, lift motors, mass flow controllers for gas injection, vacuum pump, and other associated chamber components and functions. The controller 149 preferably comprises a programmable microprocessor and executes system control software stored in a memory, which in the preferred embodiment is a hard disk drive, and can include analog and digital input/output boards, interface boards, and stepper motor controller boards (not shown). The controller 149 controls electrical power to the components of the chamber and includes a panel that allows an operator to monitor and operate the chamber. Optical and/or magnetic sensors (not shown) are generally used to move and determine the position of movable mechanical assemblies.

Figure 4:
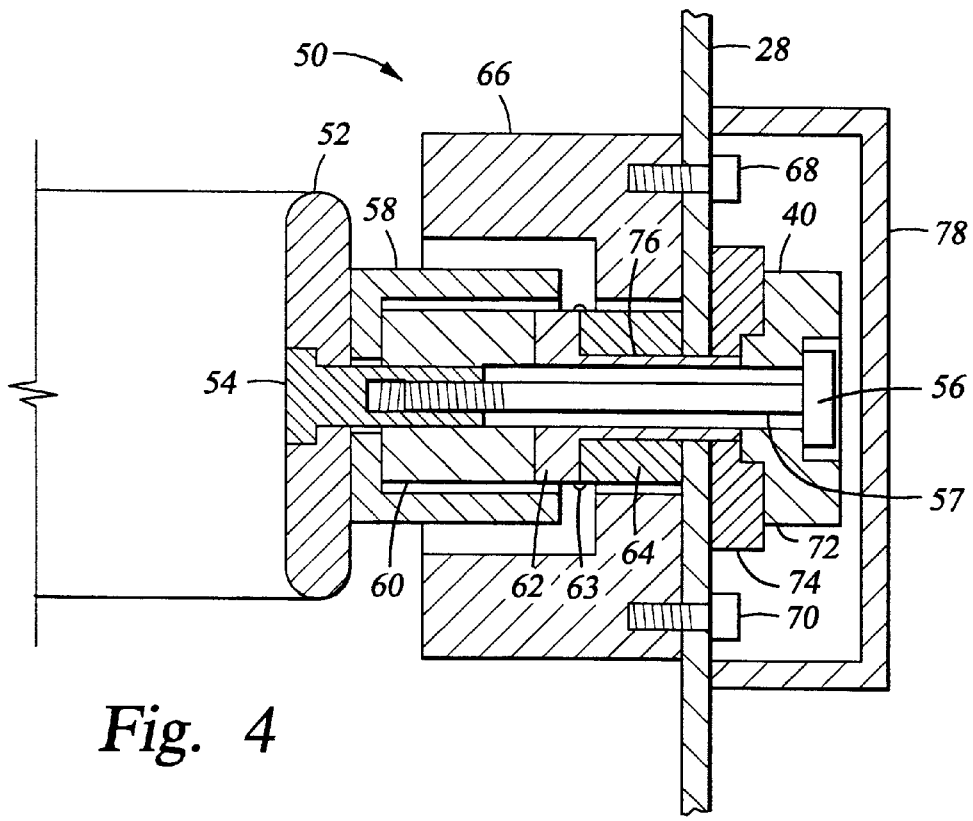
FIG. 4 is a schematic partial cross sectional view of a support supporting an electrically insulated member according to the present invention.
Figure 5:
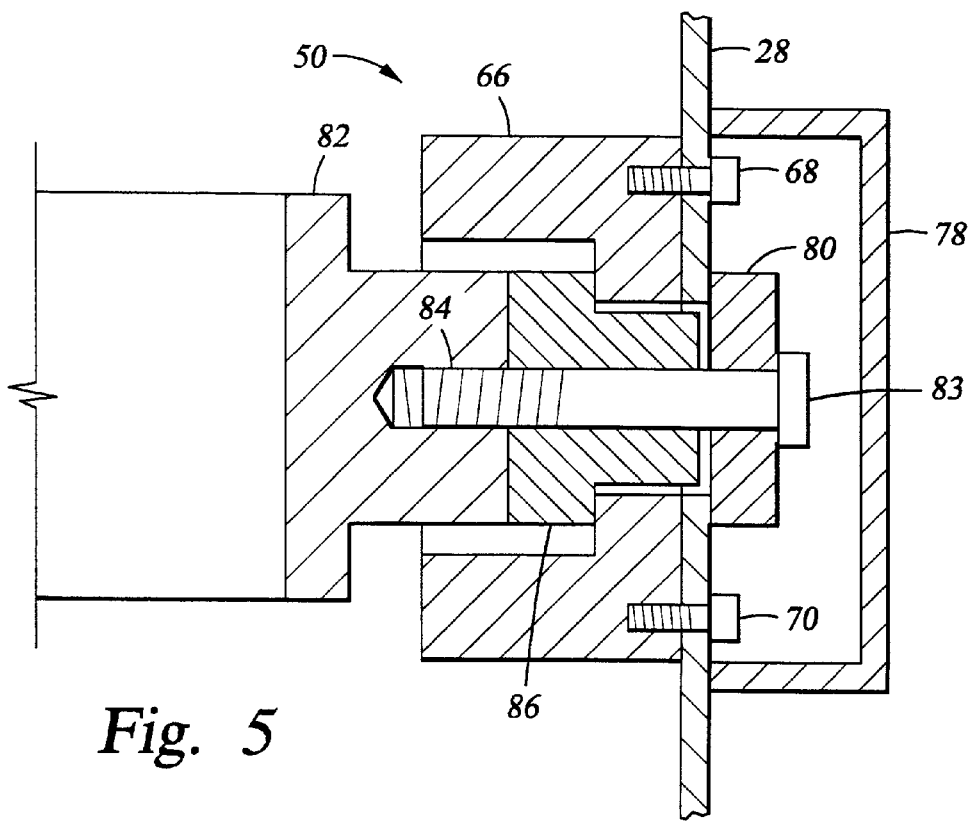
FIG. 5 is a schematic partial cross sectional view of an alternative embodiment of a support supporting an electrically insulated member according to the present invention

A support 50 of the invention, described in more detail in reference to FIGS. 4 and 5, provides electrical insulation for the coil 122 and yet also provides thermal conductance from the coil 122 for the heat generated in the substrate processing chamber 100. The material selection can be a combination of electrical insulation capabilities coupled with thermal conductance capabilities. By enabling a positive connection between the components by bonding, such as brazing, the thermal transfer is not as restricted between the component interfaces under vacuum conditions, as in prior efforts, through bolted or clamped connections. Further benefits can be obtained by limiting the number of connections to minimize the number of interfaces.

FIG. 4 is a schematic view in partial cross section of a electrically insulating and thermally conducting support 50 according to the invention that supports an electrically conductive member, e.g., a coil 52. The coil 52 is attached to a shield 28 by an internally threaded pin 54 coupled with a screw 56 having threads 57. In one embodiment, the coil is made from the same material as the target, for instance, copper. An inner cup 58 is disposed between the coil and an inner conductor 60 to protect the inner surfaces of the support 50 from the plasma. Because the inner cup is exposed to the plasma ions, generally the inner cup is also made from the same material as the coil. The inner conductor 60 can be conductive and can also be made of the same material as the coil 52 and the inner cup 58 and assists in transferring the heat from the coil 52.

A dielectric element 62 is disposed between the inner conductor 60 and toward the shield 28. The dielectric element 62 is preferably an electrically insulative and thermally conductive material. One preferred material is aluminum nitride. Another material could be beryllium oxide. Both materials exhibit a thermal conductance value of at least 90 watts per meter-degree Kelvin (W/m-K) and a dielectric strength value as an indicator of electrical resistivity of at least $10^{14}$ kilovolts/millimeter (kV/mm). Other materials having the electrical and thermal characteristics named herein would also be suitable. Disposed outward from the dielectric element 62 is an outer conductor 64 which is engaged against the shield 28 and can transmit thermal energy thereto. The outer conductor 64 can be made of conductive material, such as copper, and can be the same material as the inner conductor 60.

Thus, in one aspect, the two conductors 60, 64 and the thermally conductive dielectric element 62 transfer thermal energy between the coil 52 and the shield 28, while the dielectric element 62 provides electrical insulation between the coil 52 and the shield 28. Preferably, the thermal conductance is further enhanced by bonding at least one of the conductors 60, 64 with the dielectric element 62. As described above, the vacuum conditions of typical substrate processing resist thermal transfer between interfaces, including interfaces that are bolted or clamped together. The present invention increases the thermal conductance by bonding at least one of the conductors 60, 64 with the dielectric element 62. Bonding can be achieved by brazing, soldering, or other methods known to bond two components together. Bonding lessens the interface effects experienced due to vacuum conditions and physical clamping type connections. Preferably, the outer conductor 64 and dielectric element 62 are brazed together at joint 63. In the embodiment shown, the inner conductor 60 is not shown bonded to the dielectric element 62, although in some embodiments, such connection could further enhance the thermal conductance. Likewise, the inner cup 58 could be bonded to the coil 52 and the outer conductor 64 could be bonded to the shield 28 in some embodiments. In the embodiment shown, the lack of bonding of the outer conductor 64 to the dielectric element 62 reflects practical considerations of assembly and maintenance.

An outer cup 66, attached to the shield 28 by threaded connectors 68, 70, circumferentially encloses a portion of the inner cup 58 to reduce sputtered material deposition on the inner surfaces of the support 50 and is generally made of conductive material, such as stainless steel. Disposed outward of the shield 28, a screw head of the screw 56 engages a clamp 72 to assist in pressing the various elements together between the screw 56 at the shield 28 and the pin 54 at the coil 52. If the clamp 72 is conductive, then it may be desirable to insulate the clamp 72 from the shield 28 by a clamp insulator 74, disposed between the clamp 72 and the shield 28. If the screw 56 is non-conductive, then such insulation may be unnecessary. In the embodiment shown, the clamp 72 is electrically conductive and extends through the shield 28 and is electrically insulated from the shield 28 by a liner 76. If the clamp 72 is nonconductive, then such electrical insulation may also be unnecessary. An insulative ceramic cap 78, made of insulative material such as alumina, protects and insulates the screw 56 and/or other conductive elements from the chamber surfaces.

FIG. 5 is a schematic cross sectional view of an alternative embodiment of the support 50. In this embodiment, the coil 82 includes the inner conductor 60 and inner cup 58, shown in FIG. 4, and thus provides a continuous thermal transfer through those components without any interfaces. A dielectric element 86 is disposed between the coil 82 and the shield 28. The dielectric element 86 can be made of the same material as the dielectric element 62 shown in FIG. 4. The coil 82 and dielectric element 86 are coupled to the shield 28 by a threaded screw 83 which passes through a ceramic washer 80, through the dielectric element 86, and into a threaded hole 84 in the coil 82. The support 50 is protected on the shield 28 by the ceramic cap 78. This embodiment of the support 50 reduces the number of interfaces between the coil and the shield.

Figure 1:
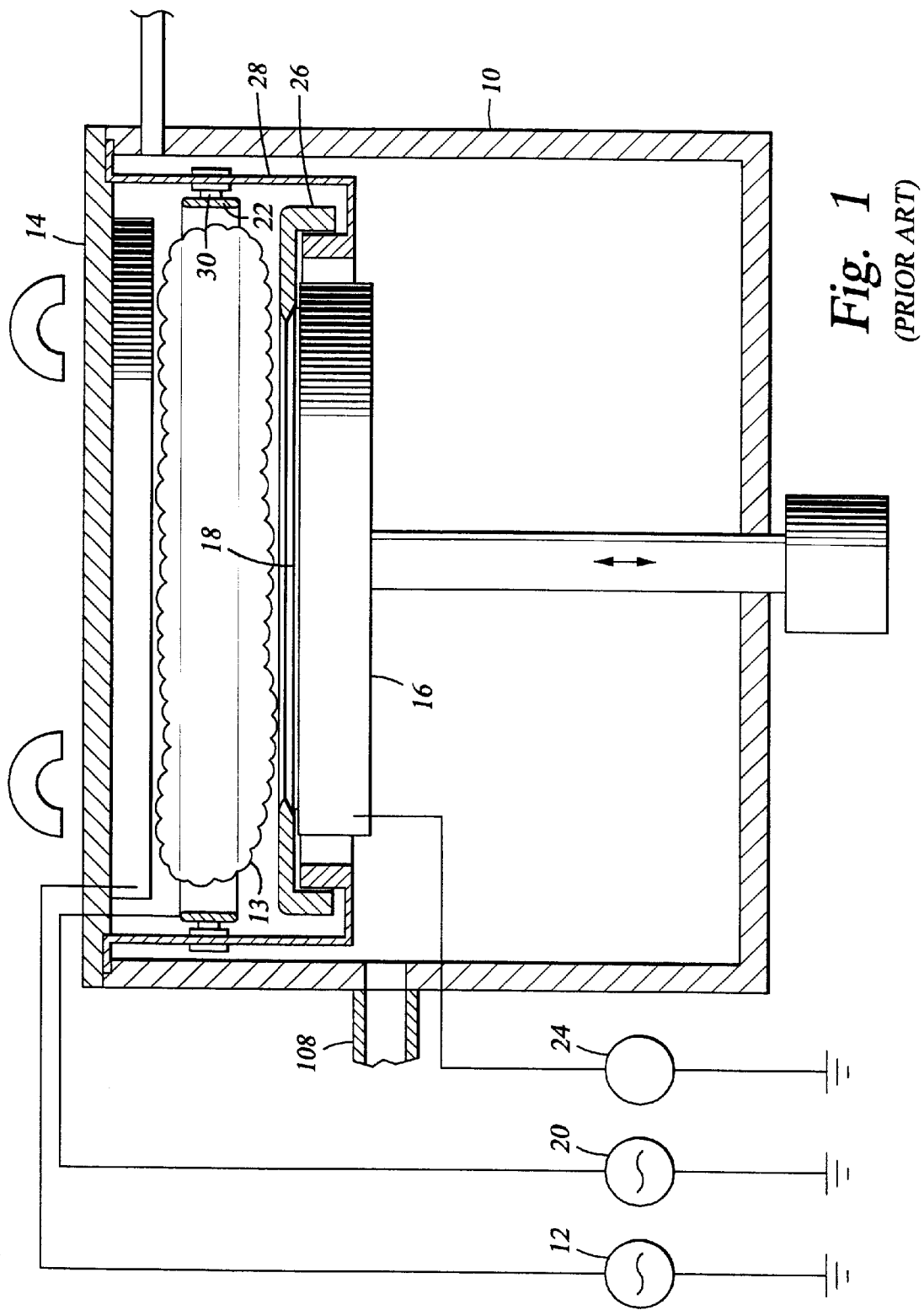
FIG. 1 is a diagram of a typical processing chamber using a coil supported by a support.
Figure 2:
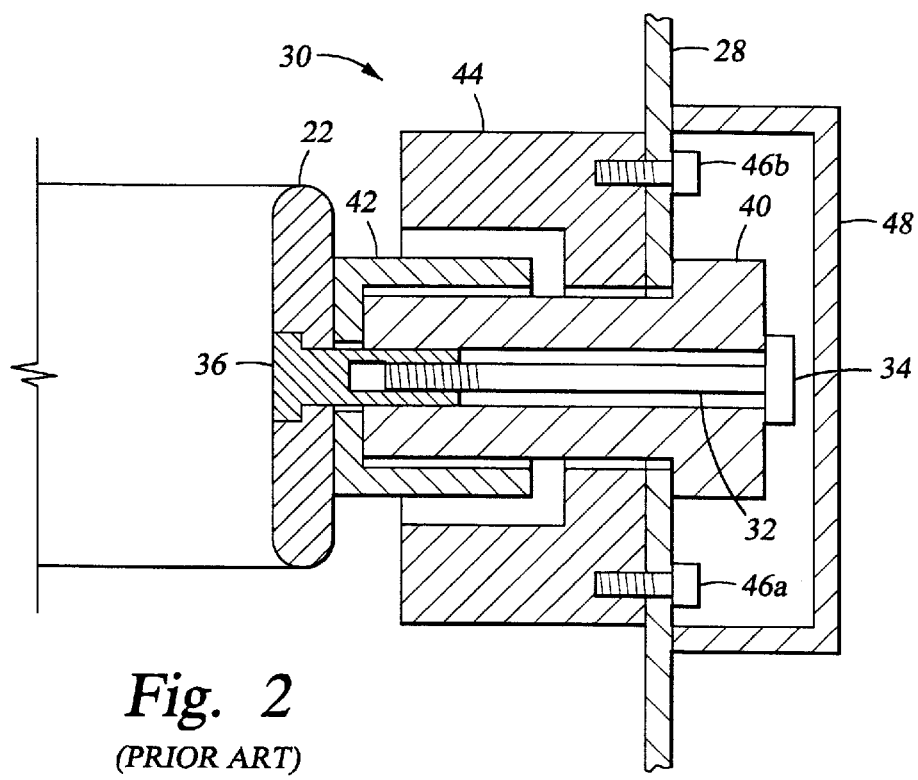
FIG. 2 is a schematic partial cross sectional view showing details of the support of FIG. 1.
Figure 6:
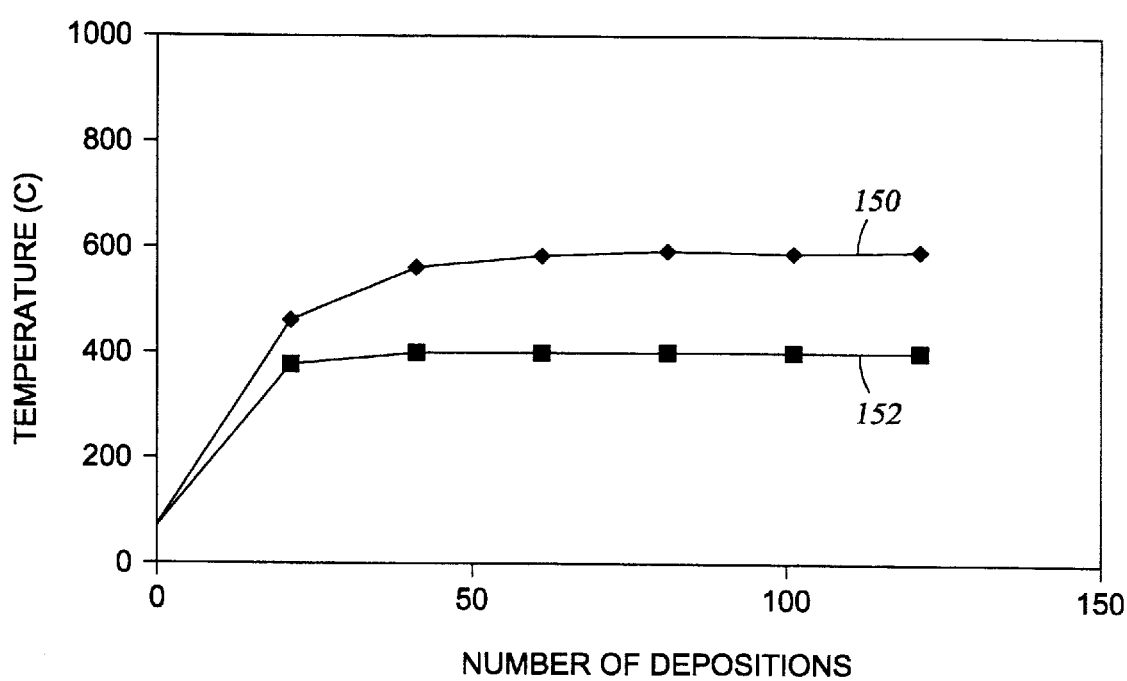
FIG. 6 is a graph showing the change in coil processing temperature between a prior art support and a support of the present invention.

FIG. 6 shows test results obtained by comparing temperatures of a typical coil 122 shown in FIG. 3 using a prior art support 30 and a support 50 of the present invention. Each support was mounted in a chamber, coupled to the coil 122, and the processing initiated. The transient coil temperature was incrementally measured over a number of deposition cycles. The process regime used for these tests was as follows. About 2000 watts (W) of DC power was delivered to the target to generate the plasma. About 2000 W of RF power was delivered to the coil 122 to densify the plasma and ionize the sputtered target material traversing the plasma. The duty cycle was about 50%, that is, the time the coil was powered was about equal to the time the coil was not powered. About 350 W of DC power was delivered to the substrate support 112 to bias the substrate 110 and attract the ionized sputtered material to the substrate 110. A chamber pressure was maintained at about 20 mTorr.

An upper line 150 shown in FIG. 5 represents the coil temperature of the prior art support 30. The coil temperature increased to about 600° C. after about 80 deposition cycles. By contrast, the lower line 154 represents the coil temperature of the support 50 of the present invention. The lower line 154 shows that the coil temperature increased to a temperature of about 400° C. after only about 40 deposition cycles and maintained this temperature for about 125 deposition cycles. Thus, the support 50 of the present invention provided a lower coil temperature and stabilized faster than a typical prior art support 30. The lower coil temperature adds stability to the substrate processing due to a smaller change in temperature of the coil from process initiation and results in less coil and plasma distortion. Other test results also show that the temperature of the shield 124 is raised slightly, about 50° C., to a temperature of about 200° C., which indicates that the support 50 is indeed conducting more heat to the shield 124 and away from the coil 122.

While foregoing is directed to the preferred embodiment of the present invention, other and further embodiments of the invention may be devised without departing from the basic scope thereof, and the scope thereof is determined by the claims that follow.

What is claimed is:

1. A system for processing a substrate, comprising:
   a chamber body defining a processing region;
   an inductive coil disposed within the processing region;
   a shield disposed at least partially around the inductive coil; and
   a support assembly for connecting the inductive coil to the shield, the support assembly comprising:
      a first electrically conducting member;
      a second electrically conducting member; and
      a thermally conductive dielectric member disposed between the first and second electrically conducting members.

2. The system of claim 1, wherein the first electrically conducting member, the second electrically conducting member, and the thermally conductive dielectric member define a fastener hole adapted to receive a fastener in order to secure the support assembly to the shield.

3. The system of claim 1, further comprising an inner cup disposed against a first surface of the first electrically conducting member, wherein a portion of the inner cup surrounds at least a portion of the first electrically conducting member.

4. The system of claim 3, wherein the inductive coil is disposed on a second surface of the inner cup opposite the first surface.

5. The system of claim 4, wherein the shield is connected to the thermally conductive dielectric member.

6. The system of claim 5, wherein the shield at least partially surrounds the first electrically conducting member, the second electrically conducting member, the thermally conductive dielectric member, the inductive coil, and the inner cup.

7. The system of claim 6, further comprising a fastener connecting the first electrically conducting member, the second electrically conducting member, the thermally conductive dielectric member, the inductive coil and the inner cup to the shield.

8. The system of claim 1, wherein the inductive coil is an annular sputtering member.

9. The system of claim 1, further comprising an outer cup disposed on the shield and forming an opening having the second electrically conducting member disposed therethrough, wherein a portion of the outer cup surrounds at least a portion of the second electrically conducting member.

10. The system of claim 1, wherein the thermally conductive dielectric member comprises a material selected from a group consisting essentially of aluminum nitride and beryllium oxide.

11. A system for processing a substrate, comprising:
    a chamber body defining a processing region;
    an inductive coil disposed within the processing region;
    a shield at least partially surrounding the inductive coil; and
    a support assembly disposed between the inductive coil and the shield, the support assembly comprising:
       a first electrically conducting member;
       a thermally conductive dielectric member disposed against the first electrically conducting member; and
       a second electrically conducting member disposed between the thermally conductive dielectric member and the shield.

12. The system of claim 11, wherein the thermally conductive dielectric member comprises a material selected from a group consisting essentially of aluminum nitride and beryllium oxide.

13. The system of claim 11, wherein the inductive coil is a sputtering member.

14. The system of claim 11, wherein the first electrically conducting member is an integral part of the inductive coil.

15. The system of claim 11, further comprising an inner cup comprising a first portion disposed between the inductive coil and the support assembly and a second portion surrounding at least a part of the support assembly.

16. The system of claim 11, further comprising an outer cup comprising a portion surrounding at least a part of the support assembly.

17. The system of claim 11, further comprising a fastener disposed through the inductive coil, the shield and the support assembly.

18. The system of claim 11, wherein the first electrically conducting member and the thermally conductive dielectric member are bonded together.

19. A system for processing a substrate, comprising:
    a chamber body defining a processing region;
    an inductive coil disposed within the processing region;
    a shield at least partially surrounding the inductive coil;
    a support assembly disposed between the inductive coil and the shield, the support assembly comprising:
       a first electrically conducting member; and
       a thermally conductive dielectric member disposed against the first electrically conducting member; and
    an inner cup comprising a first portion disposed on the inductive coil and a second portion at least partially surrounding the first electrically conducting member.

20. The system of claim 19, further comprising a second electrically conducting member disposed between the thermally conductive dielectric member and the shield.

21. The system of claim 19, wherein the inductive coil is a sputtering member.

22. The system of claim 19, wherein the first electrically conducting member is an integral part of the inductive coil.

23. The system of claim 19, further comprising an outer cup comprising a portion surrounding at least a part of the support assembly.

24. The system of claim 19, further comprising a fastener disposed through the inductive coil, the shield and the support assembly.

25. The system of claim 19, wherein the first electrically conducting member and the thermally conductive dielectric member are bonded together.

26. The system of claim 19, wherein the thermally conductive dielectric member comprises a material selected from a group consisting essentially of aluminum nitride and beryllium oxide.

27. The system of claim 19, wherein the second portion of the inner cup at least partially surrounds the thermally conductive dielectric member.

* * * * *